United States Patent
Zhao et al.

(10) Patent No.: US 9,650,709 B2
(45) Date of Patent: May 16, 2017

(54) MAGNETIC DEVICE, VAPOR DEPOSITION DEVICE AND VAPOR DEPOSITION METHOD

(71) Applicant: BOE TECHNOLOGY GROUP CO., LTD., Beijing (CN)

(72) Inventors: Dejiang Zhao, Beijing (CN); Haoran Gao, Beijing (CN); Jianwei Yu, Beijing (CN); Jie Yin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 28 days.

(21) Appl. No.: 14/435,119

(22) PCT Filed: Aug. 28, 2014

(86) PCT No.: PCT/CN2014/085426
§ 371 (c)(1),
(2) Date: Apr. 10, 2015

(87) PCT Pub. No.: WO2015/158093
PCT Pub. Date: Oct. 22, 2015

(65) Prior Publication Data
US 2016/0251747 A1    Sep. 1, 2016

(30) Foreign Application Priority Data

Apr. 18, 2014 (CN) .......................... 2014 1 0159125

(51) Int. Cl.
*C23C 16/00* (2006.01)
*C23C 14/04* (2006.01)
(Continued)

(52) U.S. Cl.
CPC ............ *C23C 14/042* (2013.01); *C23C 14/54* (2013.01); *C23C 14/12* (2013.01)

(58) Field of Classification Search
None
See application file for complete search history.

(56) References Cited

U.S. PATENT DOCUMENTS

2006/0086321 A1* 4/2006 Brody ................ C23C 14/042
118/720
2007/0006807 A1* 1/2007 Manz ................ C23C 14/042
118/720
(Continued)

FOREIGN PATENT DOCUMENTS

CN    1867216 A    11/2006
CN    101106052 A    1/2008
(Continued)

OTHER PUBLICATIONS

Second Office Action regarding Chinese application No. 201410159125.9, dated May 6, 2016. Translation provided by Dragon Intellectual Property Law Firm.
(Continued)

*Primary Examiner* — Joseph Miller, Jr.
(74) *Attorney, Agent, or Firm* — Harness, Dickey & Pierce, P.L.C.

(57) ABSTRACT

The present disclosure provides a magnetic device and a vapor deposition device. The magnetic device is configured to adsorb a metal mask in the vapor deposition device, including: a metal plate; an electromagnet array including a plurality of electromagnets; each of the electromagnets being inserted in the metal plate; a power supply module configured to supply a current; a control module configured to, when adsorbing the metal mask during a vapor deposition process, control the power supply module to supply a direct current to all or some of the plurality of electromagnets and control a direction and a size of the direct current by sending a first control signal to the power supply module.

14 Claims, 1 Drawing Sheet

(51) Int. Cl.
  *C23C 14/54* (2006.01)
  *C23C 14/12* (2006.01)

(56) References Cited

U.S. PATENT DOCUMENTS

| | | | |
|---|---|---|---|
| 2007/0072337 A1 | 3/2007 | Matsuzaki et al. | |
| 2007/0296324 A1* | 12/2007 | Yoo | C23C 14/042 |
| | | | 313/402 |
| 2012/0204794 A1* | 8/2012 | Ko | C23C 14/12 |
| | | | 118/721 |

FOREIGN PATENT DOCUMENTS

| | | |
|---|---|---|
| CN | 101675178 A | 3/2010 |
| CN | 102566336 A | 7/2012 |
| CN | 203144509 U | 8/2013 |
| CN | 103376813 A | 10/2013 |
| CN | 103952665 A | 7/2014 |
| CN | 203807546 U | 9/2014 |
| KR | 20080058944 A | 6/2008 |

OTHER PUBLICATIONS

Written Opinion of the International Searching Authority for international application No. PCT/CN2014/085426.
First Office Action regarding Chinese application No. 201410159125.9, dated Oct. 28, 2015. Translation provided by Dragon Intellectual Property Law Firm.
Third Office Action regarding Chinese application No. 201410159125.9, dated Oct. 17, 2016. Translation provided by Dragon Intellectual Property Law Firm.

* cited by examiner

MAGNETIC DEVICE, VAPOR DEPOSITION DEVICE AND VAPOR DEPOSITION METHOD

CROSS-REFERENCE TO RELATED APPLICATIONS

This application is the U.S. national phase of PCT Application No. PCT/CN2014/085426 filed on Aug. 28, 2014, which claims a priority of the Chinese patent application No. 201410159125.9 filed on Apr. 18, 2014, the disclosures of which are incorporated in their entirety by reference herein.

TECHNICAL FIELD

The present disclosure relates to the field of vapor deposition technology, in particular to a magnetic device, a vapor deposition device and a vapor deposition method.

BACKGROUND

In the field of manufacturing organic light-emitting diode (OLED) display products, using a vapor deposition method to manufacture OLED products is a relative mature method. When using the vapor deposition method to manufacture OLED components, a metal mask is required; meanwhile, in order to prevent the metal mask having a large area from bending under action of gravity, a magnetic device for adsorbing the metal mask is further added in a vapor deposition device.

As shown in FIG. 1, in a magnetic device in an existing vapor deposition device, a plurality of rows of permanent magnets are provided in a metal plate 11, wherein permanent magnets in adjacent two rows have different magnetic poles. In FIG. 1, an electromagnet indicated by N represents that it is an N pole of a permanent magnet, and an electromagnet indicated by S represents that it is an S pole of a permanent magnet. A magnetic field intensity and a magnetic pole arrangement produced by the magnetic device in the existing vapor deposition device cannot be changed, thus, when weight of the metal mask is changed, the adsorption is ensured only through changing a distance between the magnetic device and the metal mask. Particularly, when adsorbing different metal masks of high precision, it is required to select different magnetic pole arrangements; but the existing magnetic device cannot change magnetic poles conveniently, and it is required to replace the magnetic device to replace the magnetic poles.

SUMMARY

A main object of the present disclosure is to provide a magnetic device, a vapor deposition device and a vapor deposition method, which can change a magnetic field intensity and a magnetic pole arrangement during a vapor deposition, the magnetic field intensity and the magnetic pole arrangement being used for adsorbing a metal mask.

In order to achieve the above object, the present disclosure provides a magnetic device for adsorbing a metal mask in a vapor deposition device, including:

a metal plate;

an electromagnet array including a plurality of electromagnets; each of the electromagnets being inserted in the metal plate;

a power supply module configured to supply a current;

a control module configured to, when adsorbing the metal mask during a vapor deposition process, control, by sending a first control signal to the power supply module, the power supply module to supply a direct current to all or some of the plurality of electromagnets and control a direction and a size of the direct current.

In an example, the control module is further configured to, after the vapor deposition, control, by sending a second control signal to the power supply module, the power supply module to repeatedly supply an alternating current to all or some of the plurality of electromagnets until the plurality of electromagnets are demagnetized.

In an example, the electromagnets are bar electromagnets; each of the bar electromagnets is perpendicularly inserted in the metal plate; two magnetic poles of each of the bar electromagnets are located at two sides of the metal plate, respectively.

In an example, the electromagnets are U-shaped electromagnets.

In an example, the magnetic device of the present disclosure further includes a control signal transmission module; wherein the control signal transmission module is configured to send the first control signal or the second control signal to the control module.

In an example, before the vapor deposition, the control signal transmission module is connected to the control module and sends the first control signal to the control module, and during the vapor deposition, the control signal transmission module is disconnected from the control module.

In an example, after the vapor deposition, the control signal transmission module is connected to the control module and sends the second control signal to the control module; after the plurality of electromagnets is demagnetized, the control signal transmission module is disconnected from the control module.

In an example, the control module and the power supply module are inserted in a lateral side of the metal plate.

In an example, the control signal transmission module is liftable.

The present disclosure further provides a vapor deposition device for vapor depositing a component onto a base substrate, the vapor deposition device including a metal mask which is provided with an opening, wherein the vapor deposition device further includes the above magnetic device;

the magnetic device is configured to adsorb the metal mask;

the vapor deposition device vapor deposits the component onto the base substrate via the opening of the metal mask.

Alternatively, the component is an OLED component.

The present disclosure further provides a vapor deposition method, including:

loading a base substrate;

sending a first control signal from a control module to a power supply module, controlling the power supply module to supply a direct current to all or some of electromagnets and controlling a direction and a size of the direct current, so as to produce a magnetic field intensity and a magnetic pole arrangement;

performing a vapor deposition onto the base substrate and a metal mask under the magnetic field intensity and the magnetic pole arrangement.

In an example, the first control signal is sent to the control module by a control signal transmission module.

In an example, the control signal transmission module is liftable.

In an example, the control signal transmission module sends a second control signal to the control module to perform a demagnetization operation.

Comparing with the related art, the magnetic device of the present disclosure may change the magnetic field intensity and the magnetic pole arrangement by using the control module to control the power supply module to supply a direct current to all or some of the plurality of electromagnets and control a direction and a size of the direct current.

DETAILED DESCRIPTION

The technical solutions of embodiments of the present disclosure will be described hereinafter in a clear and complete manner in conjunction with drawings of the embodiments of the present disclosure. Obviously, the described embodiments are merely some rather than all of, the embodiments of the present disclosure. Based on these embodiments of the present disclosure, a person skilled in the art may obtain other embodiments without creative work, which also fall within the scope of the present disclosure.

Figure 1:
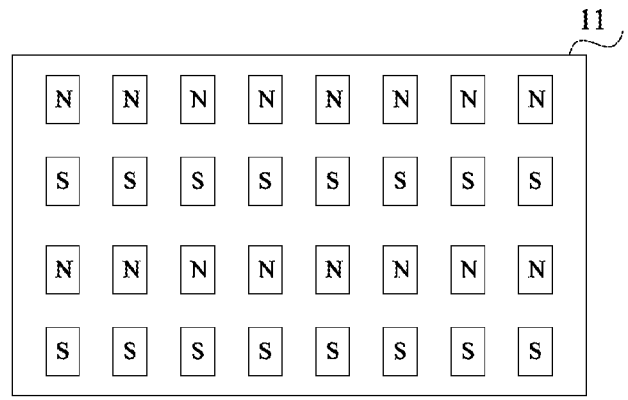
FIG. 1 is a schematic view showing an existing magnetic device applied in a vapor deposition device.
Figure 2:
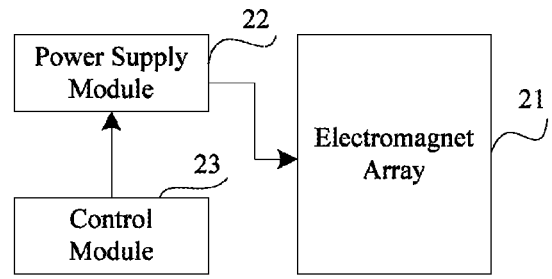
FIG. 2 is a schematic diagram showing a magnetic device according to one embodiment of the present disclosure.

As shown in FIG. 2, a magnetic device of one embodiment of the present disclosure is configured to adsorb a metal mask in a vapor deposition device and includes:

a metal plate (not shown in FIG. 2);

an electromagnet array 21 including a plurality of electromagnets; each of the electromagnets being inserted in the metal plate (not shown in FIG. 2);

a power supply module 22 configured to supply a current;

a control module 23 configured to, when adsorbing the metal mask during a vapor deposition process, control, by sending a first control signal to the power supply module 22, the power supply module 22 to supply a direct current to all or some of the plurality of electromagnets and control a direction and a size of the direct current.

The magnetic device of one embodiment of the present disclosure may change a magnetic field intensity and a magnetic pole arrangement by using the control module to control the power supply module to supply a direct current to all or some of the pluralities of electromagnets and control a direction and a size of the direct current.

In the related art, when using an electromagnet, lead wire is generally required for connecting two poles of the magnet. While in a vapor deposition device, the electromagnet is rotated together with a glass substrate during a vapor deposition process, then the problem of winding occurs. Thus, although utilization of the electromagnet has a plurality of advantages, most vapor deposition equipment cannot adopt it since the problem of winding cannot be overcome. While the magnetic device of one embodiment of the present disclosure uses the power supply module to supply a direct current to the electromagnets so that the electromagnets produce magnetic, and the power supply module may be inserted in a lateral side of the metal plate, the power supply module is immobile with respect to the metal plate when rotating, thereby to avoid winding.

In the existing vapor deposition device, after the vapor deposition, the magnetic device cannot be completely demagnetized, and the metal mask also cannot be demagnetized due to magnetic hysteresis effect and damages the metal mask when moving the metal mask. Considering this problem, in the magnetic device of one embodiment of the present disclosure, the control module 23 is further configured to, after the vapor deposition, control, by sending a second control signal to the power supply module 22, the power supply module to repeatedly supply an alternating current to all or some of the plurality of electromagnets until the plurality of magnets is demagnetized. In this way, the magnetic hysteresis effect may be eliminated.

The plurality of electromagnets included in the electromagnet array may be electromagnets of any form, may be bar electromagnets or U-shaped electromagnets, as long as ensuring a direction of the magnetic field intensity for adsorbing a metal mask.

Figure 3:
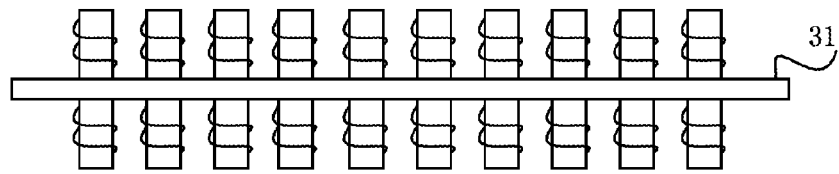
FIG. 3 is a side view showing a metal plate inserted with a plurality of bar electromagnets included in an electromagnet array of the magnetic device.

In one example, as shown in FIG. 3, the plurality of electromagnets included in the electromagnet array may be bar electromagnets, each of the bar electromagnets is perpendicularly inserted in the metal plate 31, and two magnetic poles of each of the bar electromagnets are located at two sides of the metal plate, respectively.

The plurality of bar electromagnets are arranged in an array on the metal plate 31.

In actual operation, the bar electromagnets are inserted into holes of the metal plate.

In actual operation, a density of magnetic poles of the electromagnets arranged on the metal plate is sufficiently large. When the magnetic device is applied to adsorb metal masks of different specifications, direct currents of different sizes and different directions may be selectively added to the electromagnets of the electromagnet array under control of the control module, to achieve desired process requirements.

Figure 4:
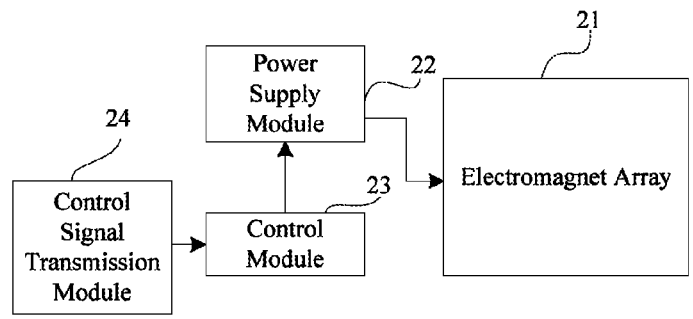
FIG. 4 is a schematic diagram showing a magnetic device according to another embodiment of the present disclosure.

In an example, as shown in FIG. 4, the magnetic device of one embodiment of the present disclosure further includes a control signal transmission module 24.

The control signal transmission module is configured to send the first control signal or the second control signal to the control module.

Before the vapor deposition, the control signal transmission module is connected to the control module and sends the first control signal to the control module.

During the vapor deposition, the control signal transmission module is disconnected from the control module.

After the vapor deposition, the control signal transmission module is connected to the control module and sends the second control signal to the control module.

After the plurality of electromagnets is demagnetized, the control signal transmission module is disconnected from the control module.

In actual application, the control module and the power supply module may be inserted in a lateral side of the metal plate, and the control signal transmission module may be liftable.

The present disclosure further provides a vapor deposition device for vapor depositing components on a base substrate, including a metal mask. The metal mask is provided with an opening. The vapor deposition device further includes the above magnetic device.

The loaded base substrate is located between the magnetic device and the metal mask.

The magnetic device is configured to adsorb the metal mask.

The vapor deposition device vapor deposits the components onto the base substrate via the opening of the metal mask.

Alternatively, the components may be organic light-emitting diode (OLED) components.

The present disclosure further provides a vapor deposition method, including:
  loading a base substrate;
  sending a first control signal from a control module to a power supply module, controlling the power supply module to supply a direct current to all or some of the plurality of electromagnets and controlling a direction and a size of the direct current, so as to produce a required magnetic field intensity and magnetic pole arrangement;
  performing a vapor deposition onto the base substrate and a metal mask under the magnetic field intensity and the magnetic pole arrangement.

Alternatively, a control signal transmission module sends the first control signal to the control module.

Alternatively, the control signal transmission module may be liftable.

Alternatively, the control signal transmission module sends a second control signal to the control module to perform a demagnetization operation.

Specifically, the base substrate may be loaded and pre-aligned, and the control signal transmission module is lowered; after the control signal transmission module sends the first control signal to the control module, the control module selects a magnetic field intensity and a magnetic pole arrangement through the first control signal, so that the metal mask and the base substrate are adsorbed together to prevent the metal mask from bending. After alignment is completed and the magnetic field intensity is stable, the control signal transmission module is raised, the control signal transmission module is separated from the control module, the base substrate and the metal mask start to rotate in the stable magnetic field, and stop at an initial position after the vapor deposition. After the vapor deposition operation, the control signal transmission module is lowered and sends out the second control signal to perform a demagnetization operation. After the demagnetization operation, the control signal transmission module is raised; the base substrate and the metal mask are separated to prevent damage of the metal mask caused by the magnetic hysteresis.

In the above embodiments, the base substrate may be a transparent substrate such as a glass substrate, a quartz substrate, or a plastic substrate; a patterned material layer is formed on the base substrate by the vapor deposition device via the metal mask, thereby forming the components.

The above descriptions are merely intended to illustrate but not limit the present disclosure. It should be appreciated that, various changes, variations or equivalents may be made by one skilled in the art without departing from the spirit and scope defined by appended claims. Therefore, all the changes, variations or equivalents may fall within the protection scope of the present disclosure.

What is claimed is:

1. A magnetic device for adsorbing a metal mask in a vapor deposition device, the magnetic device comprising:
  a metal plate;
  an electromagnet array comprising a plurality of electromagnets, each of the electromagnets being inserted in the metal plate;
  a power supply module configured to supply a current;
  a control module configured to, when adsorbing the metal mask during a vapor deposition process, control, by sending a first control signal to the power supply module, the power supply module to supply a direct current to all or some of the plurality of electromagnets and control a direction and a size of the direct current,
  wherein the control module is further configured to, after the vapor deposition, control, by sending a second control signal to the power supply module, the power supply module to repeatedly supply an alternating current to all or some of the plurality of electromagnets until the plurality of electromagnets are demagnetized,
  the control module and the power supply module are inserted in a lateral side of the metal plate, and
  during vapor deposition, the electromagnet array, the control module and the power supply module are rotatable along with the metal plate.

2. The magnetic device according to claim 1, wherein the electromagnets are bar electromagnets, each of the bar electromagnets is inserted in the metal plate, and two magnetic poles of each of the bar electromagnets are located at two sides of the metal plate, respectively.

3. The magnetic device according to claim 1, wherein the electromagnets are U-shaped electromagnets.

4. The magnetic device according to claim 1, further comprising a control signal transmission module, wherein the control signal transmission module is configured to send a signal to the control module, to control the control module to send the first control signal or the second control signal.

5. The magnetic device according to claim 4, wherein before the vapor deposition, the control signal transmission module is connected to the control module and sends the first control signal to the control module, and during the vapor deposition, the control signal transmission module is disconnected from the control module.

6. The magnetic device according to claim 4, wherein after the vapor deposition, the control signal transmission module is connected to the control module and sends the second control signal to the control module; and
  after the plurality of electromagnets are demagnetized, the control signal transmission module is disconnected from the control module.

7. The magnetic device according to claim 4, wherein the control signal transmission module is liftable.

8. A vapor deposition device for vapor depositing a component onto a base substrate, the vapor deposition device comprising a metal mask which is provided with an opening, wherein the vapor deposition device further comprises the magnetic device according to claim 1;
  the magnetic device is configured to adsorb the metal mask; and
  the vapor deposition device vapor deposits the component onto the base substrate via the opening of the metal mask.

9. The vapor deposition device according to claim 8, wherein the component is an OLED component.

10. A vapor deposition method,
  wherein the vapor deposition device comprises a magnetic device for adsorbing a metal mask in the vapor deposition device, the magnetic device comprises a metal plate; an electromagnet array comprising a plurality of electromagnets, each of the electromagnets being inserted in the metal plate; a power supply module configured to supply a current; a control module configured to, when adsorbing the metal mask during a vapor deposition process, control, by sending a first control signal to the power supply module, the power supply module to supply a direct current to all or some of the plurality of electromagnets and control a direction and a size of the direct current, wherein the control module is further configured to, after the vapor deposition, control, by sending a second control signal to the power supply module, the power supply module to repeatedly supply an alternating current to all or some of the plurality of electromagnets until the plurality of electromagnets are demagnetized, the control module and the power supply module are inserted in a lateral side of the metal plate, and during vapor deposition, the electromagnet array, the control module and the power supply module are rotatable along with the metal plate, the method comprises:

loading a base substrate in the vapor deposition device;

sending a first control signal from a control module to a power supply module, controlling the power supply module to supply a direct current to all or some of a plurality of electromagnets and controlling a direction and a size of the direct current, so as to produce a magnetic field intensity and a magnetic pole arrangement; and performing vapor deposition on the base substrate and a metal mask under the magnetic field intensity and the magnetic pole arrangement;

wherein the method further comprises:

after the vapor deposition, sending a second control signal from the control module to the power supply module, controlling the power supply module to repeatedly supply an alternating current to all or some of the plurality of electromagnets until the plurality of electromagnets are demagnetized.

11. The vapor deposition method according to claim 10, wherein the first control signal is sent to the control module by a control signal transmission module.

12. The vapor deposition method according to claim 10, wherein the control signal transmission module is liftable.

13. The vapor deposition method according to claim 11, further comprising:

sending the second control signal to the control module by the control signal transmission module to perform a demagnetization operation.

14. The vapor deposition method according to claim 12, further comprising:

sending the second control signal to the control module by the control signal transmission module to perform a demagnetization operation.

* * * * *